(12) United States Patent  
Chambers et al.

(10) Patent No.: US 8,748,996 B2  
(45) Date of Patent: Jun. 10, 2014

(54) SEMICONDUCTOR DEVICE INCLUDING SION GATE DIELECTRIC WITH PORTIONS HAVING DIFFERENT NITROGEN CONCENTRATIONS

(71) Applicant: Texas Instruments Incorporated, Dallas, TX (US)

(72) Inventors: James Joseph Chambers, Dallas, TX (US); Hiroaki Niimi, Dallas, TX (US); Brian Keith Kirkpatrick, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/862,581

(22) Filed: Apr. 15, 2013

(65) Prior Publication Data

US 2013/0228879 A1    Sep. 5, 2013

Related U.S. Application Data

(62) Division of application No. 12/710,709, filed on Feb. 23, 2010, now Pat. No. 8,441,078.

(51) Int. Cl.  
*H01L 21/02* (2006.01)

(52) U.S. Cl.  
USPC ........... 257/411; 257/410; 257/392; 257/369; 257/E29.255

(58) Field of Classification Search  
CPC .................... H01L 51/0533; H01L 29/518  
USPC ............ 257/410–411, 392, 369, E29.255  
See application file for complete search history.

(56) References Cited

U.S. PATENT DOCUMENTS

| | | | |
|---|---|---|---|
| 6,548,366 B2 | 4/2003 | Niimi | |
| 6,821,873 B2 | 11/2004 | Visokay | |
| 7,144,825 B2 | 12/2006 | Adetutu et al. | |
| 2006/0062917 A1 | 3/2006 | Muthukrishnan et al. | |
| 2006/0156970 A1 | 7/2006 | Dong-Suk et al. | |
| 2006/0216944 A1 | 9/2006 | Kraus et al. | |
| 2008/0032510 A1 | 2/2008 | Olsen | |
| 2009/0088002 A1 | 4/2009 | Liu et al. | |
| 2009/0184401 A1 | 7/2009 | Matsushita et al. | |

*Primary Examiner* — Elias M Ullah  
(74) *Attorney, Agent, or Firm* — Jacqueline J. Garner; Wade J. Brady, III; Frederick J. Telecky, Jr.

(57) ABSTRACT

An integrated circuit (IC) includes a substrate having a top semiconductor surface including at least one MOS device including a source and a drain region spaced apart to define a channel region. A SiON gate dielectric layer that has a plurality of different N concentration portions is formed on the top semiconductor surface. A gate electrode is on the SiON layer. The plurality of different N concentration portions include (i) a bottom portion extending to the semiconductor interface having an average N concentration of <2 atomic %, (ii) a bulk portion having an average N concentration >10 atomic %, and (iii) a top portion on the bulk portion extending to a gate electrode interface having an average N concentration that is ≥2 atomic % less than a peak N concentration of the bulk portion.

9 Claims, 4 Drawing Sheets

ID) including MOS transistors having SiON gate dielectrics.

SEMICONDUCTOR DEVICE INCLUDING SiON GATE DIELECTRIC WITH PORTIONS HAVING DIFFERENT NITROGEN CONCENTRATIONS

CROSS REFERENCE TO RELATED APPLICATIONS

This application is a divisional of U.S. Nonprovisional patent application Ser. No. 12/710,709, filed Feb. 23, 2010, the contents of which are herein incorporated by reference in its entirety.

FIELD

Disclosed embodiments relate to integrated circuits (ICs) including MOS transistors having SiON gate dielectrics.

BACKGROUND

Replacing conventional silicon oxide (e.g. $SiO_2$) gate dielectrics with silicon oxynitride (e.g. SiON) layers for MOS transistors reduces gate dielectric leakage and boron (B) penetration from the gate electrode into the semiconductor surface which can result in Vt shifts. A conventional method to form a SiON gate dielectric layer includes thermal oxidation of silicon to form a $SiO_2$ base dielectric, followed by a plasma nitridation to incorporate nitrogen (N) throughout the $SiO_2$ dielectric, and then a thermal anneal in $O_2/N_2$ at around 1100° C.

This conventional method results in a relatively constant N concentration in the thickness direction of the SiON layer. It is known that as the N concentration in the bulk of the SiON layer is increased, gate leakage and boron penetration (for B doped polysilicon gates) into the semiconductor surface decreases, and that as the N concentration at the semiconductor interface increases, the carrier mobility at the semiconductor surface (and thus the device transconductance (Gm)), as well as delta threshold voltage (Vt) and negative bias temperature instability (NBTI) all degrade. Therefore, due to the relatively constant N concentration in the thickness direction of the SiON layer provided by the conventional method, the amount of N that can be incorporated into the bulk of the SiON layer is limited by the degree of carrier mobility degradation due to N at the semiconductor interface that can be tolerated in the IC design. This situation results in a trade-off in the N concentration in the SiON layer between the amount of leakage reduction/B blocking and the carrier mobility (and thus Gm). As a result of this tradeoff, the N concentration selected is generally no more than about 10-15 atomic %.

SUMMARY

This Summary is provided to comply with 37 C.F.R. §1.73, presenting a summary of the disclosed embodiments to briefly indicate the nature and substance of this Disclosure. It is submitted with the understanding that it will not be used to interpret or limit the scope or meaning of the claims.

Disclosed embodiments provide SiON gate dielectrics that decouple the N concentration away from the semiconductor interface (e.g. in the bulk of the SiON layer) of the SiON dielectric from the N concentration at the SiON semiconductor interface. This decoupling allows the average N concentration at the semiconductor interface to be significantly lower (e.g. at least a factor of 2, such as a factor of >5) as compared to the average N concentration away from semiconductor interface to simultaneously achieve low leakage, high B blocking, and high carrier mobility at the semiconductor surface. Disclosed embodiments thus provide SiON gate dielectrics that eliminate the conventional trade-off in the N concentration between the amount of leakage reduction/B blocking and the carrier mobility.

In one embodiment, the SiON dielectric layer includes three different N concentration portions. A top portion provides a top interface with the gate electrode (e.g. polysilicon) that has a moderate average N concentration, a bulk portion that has the highest peak N concentration, and a bottom portion that provides a semiconductor interface with the top semiconductor surface that has the lowest average N concentration.

The Inventors have discovered that the moderate average N concentration at the top portion of the SiON dielectric layer can reduce B deactivation in the case the gate electrode comprises polysilicon to minimize poly depletion. The high N concentration including a peak N concentration in the bulk portion enables leakage reduction and a reduction in B penetration into the semiconductor surface. The bottom portion has the lowest N concentration to maximize the carrier mobility in the channel region, and to reduce the Vt shift and NBTI degradation.

DETAILED DESCRIPTION

Figure 1:
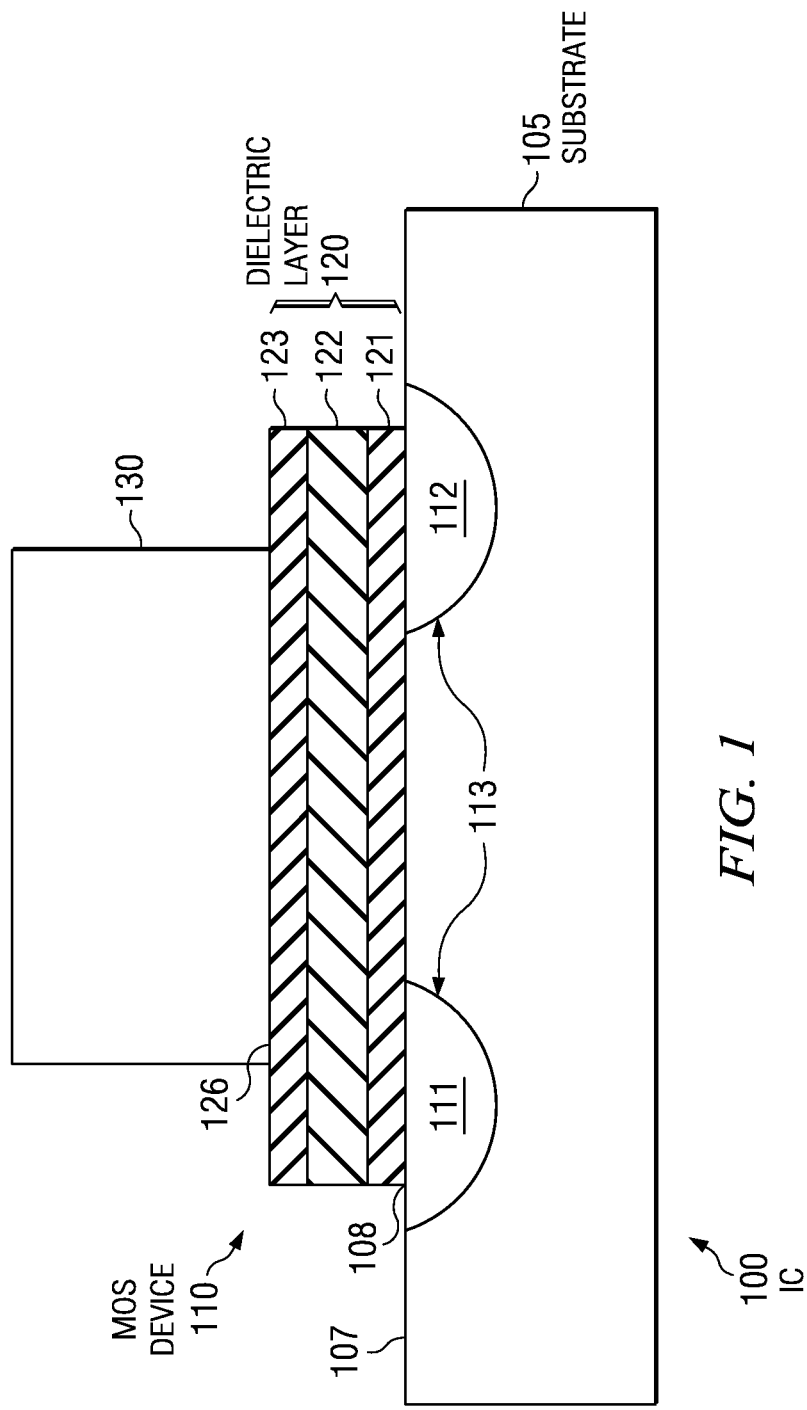
FIG. 1 is a cross sectional view of a portion of an integrated circuit (IC) including a substrate having a top semiconductor surface including at least one MOS device that includes a SiON gate dielectric layer having a plurality of different N concentration portions, according to a disclosed embodiment.

Disclosed embodiments are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the disclosed embodiments can be practiced without one or more of the specific details or with other methods. In other instances, well-known structures or operations are not shown in detail to avoid obscuring the disclosed embodiments. The disclosed embodiments are not limited by the illustrated ordering of acts or events, as some acts may occur in different orders and/or concurrently with other acts or events. Furthermore, not all illustrated acts or events are required to implement a methodology in accordance with disclosed embodiments.

FIG. 1 is a cross sectional view of a portion of an integrated circuit (IC) 100 including a substrate 105 having a top semiconductor surface 107 including at least one MOS device 110 that includes a SiON gate dielectric layer 120 having a plurality of different N concentration portions, according to a disclosed embodiment. Top semiconductor interface 108 shown in FIG. 1 represents the interface between dielectric layer 120 and the top semiconductor surface 107. Substrate 105 may include any one of a bulk silicon substrate, SiGe substrate, strain silicon substrate, an SOI substrate, or other single crystal substrate.

The MOS device is shown in a highly simplified form and as shown includes a source 111 and a drain region 112 spaced apart to define a channel region 113. Features such as LDDs, spacers and additional implants (e.g. halo) are not shown to avoid obscuring inventive details. The SiON layer 120 has a plurality of different N concentration portions and is formed on the top semiconductor surface 107. A gate electrode 130 is on the SiON layer 120. In one embodiment, the gate electrode 130 comprises polysilicon, such as P+ (e.g. B) doped for PMOS devices and N+ doped for NMOS devices. In other embodiments, the gate electrode 130 comprises a metal gate, such as when a replacement metal gate process is employed, so that the gate electrode 130 can comprise metal gates such as W/TiN, Mo, Ta, TaN, TiN or $TaSi_xN_y$.

The plurality of different N concentration portions include (i) a bottom portion 121 extending to the semiconductor interface at the top semiconductor surface 107 having an average N concentration of <2 atomic %, (ii) a bulk portion 122 having an average N concentration >10 atomic %, and (iii) a top portion on the bulk portion extending to a gate electrode interface 126 having an average N concentration that is ≥2 atomic % less than the peak N concentration of the bulk portion 122.

Although not shown in FIG. 1, IC 100 generally includes other active circuitry, comprising circuit elements that generally include other transistors including bipolar transistors, diodes, capacitors, and resistors, as well as signal lines and other conductors that interconnect these various circuit elements.

Figure 2:
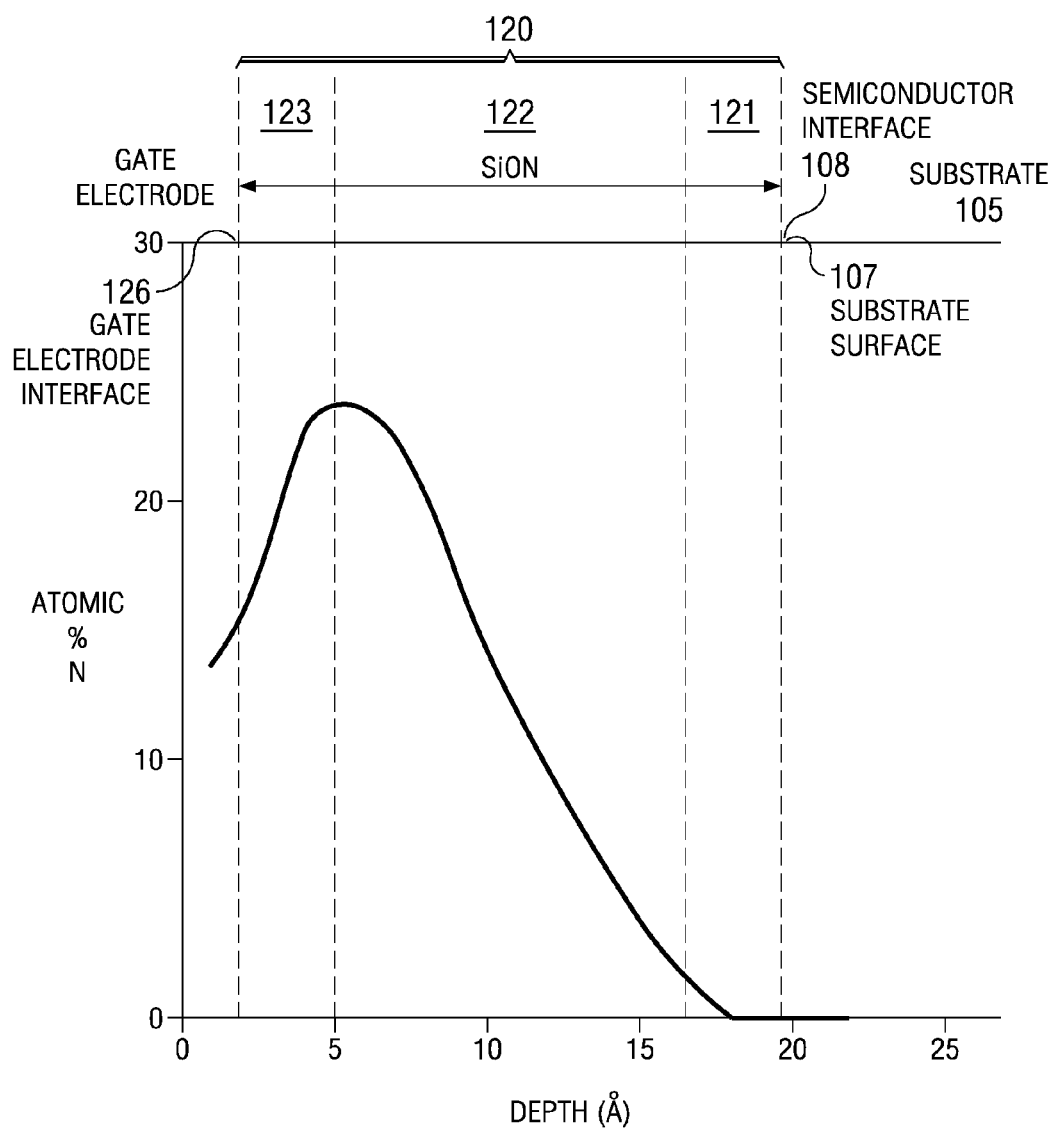
FIG. 2 is a graphical representation of a N concentration profile for an exemplary SiON gate dielectric layer based on High Resolution Rutherford Backscatter (HR-RBS) data obtained having a plurality of different N concentration portions, according to a disclosed embodiment.

FIG. 2 is a graphical representation of a N concentration profile from RBS data obtained for an exemplary SiON gate dielectric layer 120 actually fabricated having a plurality of different N concentration portions, such as SiON layer 120 shown in FIG. 1 comprising portions 121, 122, 123, according to a disclosed embodiment. Each monolayer of SiON is generally about 2.7 Angstroms thick. As used herein, each monolayer of SiON corresponds to between 2.5 to 3 Angstroms in SiON thickness. As shown, the bottom portion 121 has a thickness between 1 and 2 monolayers (corresponding to 2.5 to 6 Angstroms thick), the bulk portion 122 has a thickness of 2 to 6 monolayers (corresponding to 5 to 18 Angstroms thick), and the top portion 123 has a thickness of 1 to 2 monolayers (corresponding to 2.5 to 6 Angstroms thick).

FIG. 2 is a graphical representation of a N concentration profile for an exemplary SiON gate dielectric layer based on HR-RBS data obtained having a plurality of different N concentration portions, according to a disclosed embodiment. FIG. 2 evidences a N concentration of portion 121 at the semiconductor interface 108 of <2 atomic %, with a N concentration level below the detection limit as shown. The peak N concentration is in the bulk portion 122 is seen to be at least 15 atomic %, with about 24 atomic % shown. The top portion 123 has an average N concentration that can be seen to be ≥2 atomic % less than the peak N concentration of the bulk portion 122. The (mathematical) average N concentration throughout the SiON layer 120 is seen to be at least 8 atomic %. In other embodiments, the average N concentration throughout the SiON layer 120 is ≥10 atomic %.

Figure 3:
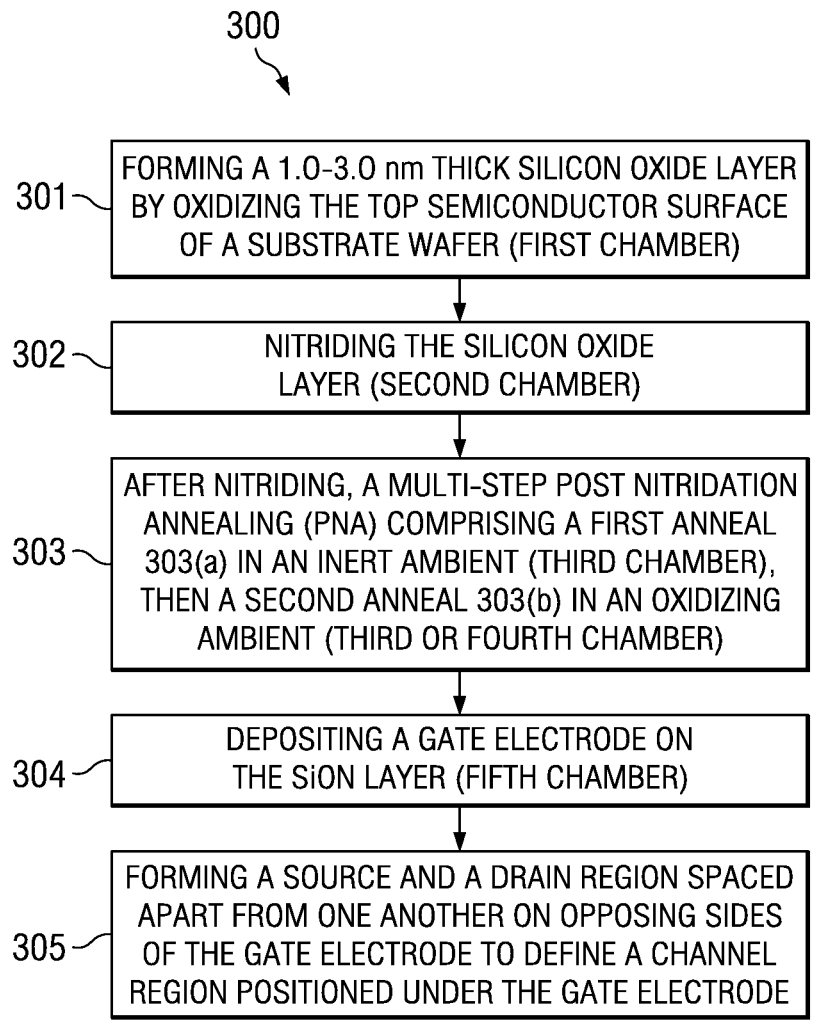
FIG. 3 is a flow chart of an exemplary method for forming an IC comprising at least one MOS device comprising a SiON gate dielectric layer having a plurality of different N concentration portions on a substrate wafer having a top semiconductor surface, according to a disclosed embodiment.

FIG. 3 is a flow chart of an exemplary method 300 for forming an IC including at least one MOS device comprising a SiON comprising gate dielectric having a plurality of different N concentration portions on a substrate wafer having a top semiconductor surface, according to a disclosed embodiment. Step 301 comprises forming a 1.0-3.0 nm thick silicon oxide layer by oxidizing the top semiconductor surface. In one embodiment the thickness of the silicon oxide layer is 1.0 to 2.0 nm. The embodiment described relative to FIG. 2 used a nearly 2 nm silicon oxide layer. The silicon oxide layer can be grown by oxidation in ambients such as $O_2$, $O_2+H_2$, $N_2O$, $N_2O+H_2$, $H_2O$, in a temperature range of 800-1100° C., at a pressure of 0.001-100 Torr, for a time of 1-60 s. Reduced pressure (i.e. sub-atmospheric pressure) oxidation reduces the oxidation rate to limit the thickness of the silicon oxide layer.

Step 302 comprises nitriding the silicon oxide layer. The nitridation performed in the nitriding step 302 is used to set the basic shape of the nitrogen concentration profile such that the N concentration in the bulk portion 122 of the SiON layer 120 is sufficiently high to provide leakage current (Jg) reduction and B blocking (for B doped silicon gates), while being shallow enough to prevent nitridation of the top semiconductor interface 108 and resulting mobility/delta Vt degradation. The nitridation can be performed in an $N_2$ plasma, $N_2$+He plasma, $N_2$+ noble gas plasma or an $NH_3$-containing plasma. In another embodiment, the nitridation is performed in $NH_3$ or $NH_3$ containing ambient at a temperature of 500-1000° C., at a pressure of 0.001-100 Torr, for a time of 1-60 s.

Step 303 comprises, after the nitriding, a multi-step post nitridation annealing (PNA) comprising a first anneal 303(a) in an inert ambient. The first anneal 303(a) is an inert anneal that can remove weakly bonded N and stabilize the remaining N in the SiON layer 120 such that it is less likely to diffuse out from the SiON layer during subsequent thermal processing. In one embodiment the first anneal is performed in a $N_2$ or a noble gas ambient at a temperature from 500-1100° C., at a pressure of 0.001-760 Torr, for a time of 0.1-60 s.

The first anneal 303(a) is followed by a second anneal 303(b) in an oxidizing ambient. The second (oxidizing) anneal 303(b) can heal remaining defects in the SiON layer without subjecting the dielectric at the semiconductor interface 108 to additional oxidation in order to prevent degradation of the electrical thickness of the SiON layer. The second anneal 303(b) is an oxidizing anneal that can also reduce the N concentration at the top portion of the SiON layer which the Inventors herein have discovered can be helpful for polysilicon gates in order to reduce the N-content in order to avoid an increase in polysilicon depletion that can result from BN formation. In one embodiment the second anneal is performed in an oxygen containing gas including pure $O_2$ gas at 500-1100° C., at a pressure of 0.001-100 Torr, for a time of 0.1-120 s. In another embodiment, the first anneal and the second anneal of the PNA are performed in a common chamber (e.g. single wafer rapid thermal annealer (RTA)).

Step 304 comprises depositing a gate electrode on the SiON layer. In one embodiment, the gate electrode can comprise polysilicon. Polysilicon can be deposited using a silicon comprising gas, such as $SiH_4$, $Si_2H_6$, $Si_2Cl_6$ or $SiH_2Cl_2$, etc., at a temperature of 500-800° C., at a pressure of 1-100 Torr, for a time from 10-300 s. In other embodiments, the gate electrode can comprise a metal gate, such as W/TiN, Mo, Ta, TaN, TiN or TaSi$_x$N$_y$, in the case of a replacement gate process.

In one embodiment, reduced pressure is maintained between step 302 and step 304 at a level below 300 Torr, such as a level below 100 Torr. The Inventors have found that performing such steps in reduced pressure prevents uncontrolled N-loss due to reaction of the SiON layer with ambient oxygen and also prevents the SiON layer from being contaminated from adventitious carbon both of which can degrade device performance for MOS devices in terms of electrical thickness and Vt control. Maintaining reduced pressure allows the SiON layer to be essentially carbon free (e.g. <0.2 atomic % C). For example, on one embodiment, forming the silicon oxide layer (step 301) takes place in a first chamber, the substrate is transferred under reduced pressure to a second chamber, wherein the nitriding (step 302) takes place in the second chamber. The substrate is transferred under reduced pressure to a third chamber, wherein the first anneal 303(a) takes place in a third chamber. The substrate is transferred under reduced pressure to a fourth chamber, wherein the second anneal 303(b) takes place in the fourth chamber. The substrate is transferred at step 304 under reduced pressure to a fifth chamber, wherein the gate electrode is deposited in the fifth chamber.

Step 305 comprises forming a source and a drain region spaced apart from one another on opposing sides of the gate electrode to define a channel region positioned under the gate electrode. Conventional processing can be used for step 305, and subsequent steps to complete fabrication of the IC.

Embodiments of the invention can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, embodiments of the invention can be used in a variety of processes including bipolar, CMOS, BiCMOS and MEMS.

EXAMPLES

Disclosed embodiments are further illustrated by the following specific Examples, which should not be construed as limiting the scope or content of embodiments disclosed herein in any way.

Figure 4:
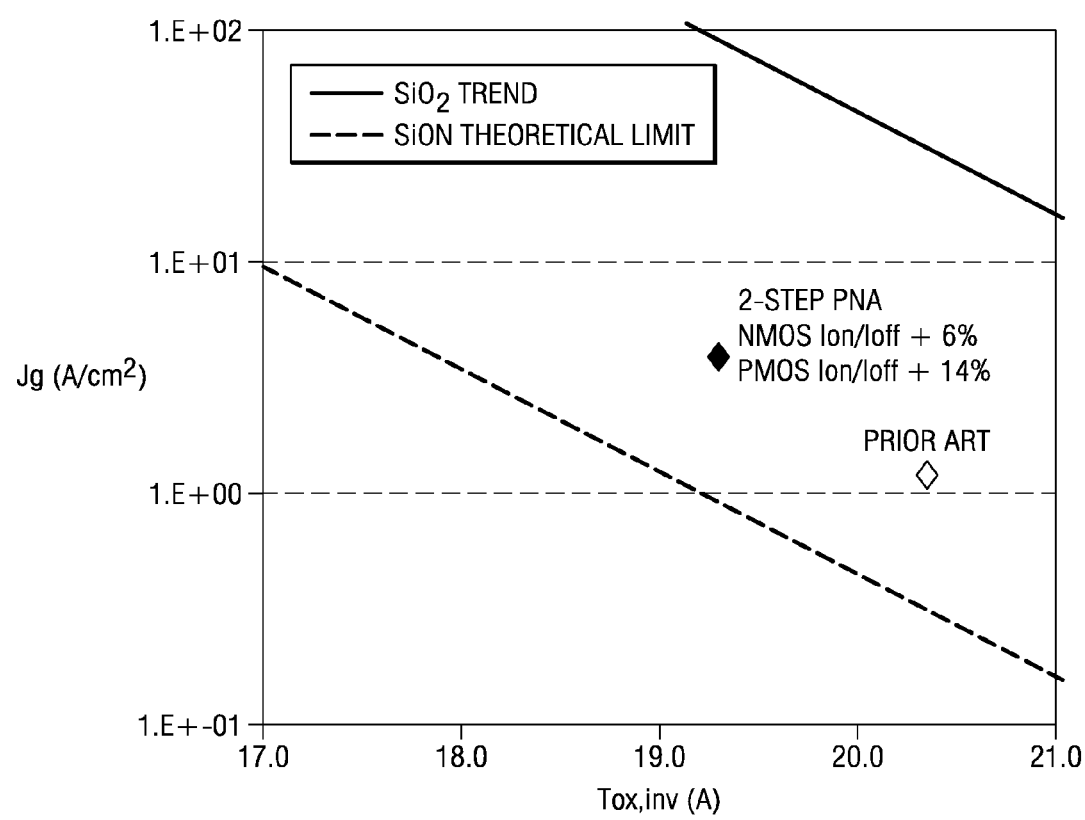
FIG. 4 a plot of gate leakage density (Jg ($A/cm^2$)) versus inversion electrical thickness (Tox, inv (Angstroms)) for a SiON gate dielectric layer formed using a 2-step post nitridation anneal as compared to a SiON gate dielectric layer formed using a conventional single step $N_2/O_2$ PNA, according to a disclosed embodiment.

FIG. 4 a plot of gate leakage density (Jg (A/cm$^2$)) versus inversion electrical thickness (Tox, inv (Å)) for a SiON gate dielectric layer formed using a 2-step PNA compared to a SiON gate dielectric layer formed using a conventional single step N$_2$/O$_2$ PNA, according to a disclosed embodiment. It can be seen that the 2-Step PNA described herein (inert anneal followed by an oxidizing anneal) results in superior Jg/Tox, inv and Ion/Ioff performance as compared to the single step N$_2$/O$_2$ PNA (shown as "Prior Art").

While various embodiments of the invention have been described above, it should be understood that they have been presented by way of example only, and not limitation. Numerous changes to the disclosed embodiments can be made in accordance with the disclosure herein without departing from the spirit or scope of the disclosed embodiments. Thus, the breadth and scope of embodiments of the invention should not be limited by any of the above explicitly described embodiments. Rather, the scope of the invention should be defined in accordance with the following claims and their equivalents.

Although the embodiments of invention have been illustrated and described with respect to one or more implementations, equivalent alterations and modifications will occur to others skilled in the art upon the reading and understanding of this specification and the annexed drawings. In addition, while a particular feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to embodiments of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. The Abstract of this Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. An integrated circuit (IC), comprising:
    a substrate having a top semiconductor surface including at least one MOS device, said MOS device comprising:
        a source and a drain region spaced apart to define a channel region;
        a SiON gate dielectric layer having a plurality of different N concentration portions formed on said top semiconductor surface including over said channel region;
        a gate electrode on said SiON layer including over said channel region,
        wherein said plurality of different N concentration portions include (i) a bottom portion extending to a semiconductor interface with said top semiconductor surface having an average N concentration of <2 atomic %, (ii) a bulk portion on said bottom portion having an average N concentration >10 atomic %, and (iii) a top portion on said bulk portion extending to a gate electrode interface with said gate electrode having an average N concentration that is ≥2 atomic % less than a peak N concentration of said bulk portion.

2. The IC of claim 1, wherein said bottom portion is 1-2 monolayer thick, said bulk portion is 2-6 monolayer thick and said peak N concentration of said bulk portion is 20-40 atomic %, and wherein and said top portion is 1-2 monolayers thick and has an average N concentration of 4 to 18 atomic %.

3. The IC of claim 1, wherein said gate electrode comprises polysilicon.

4. The IC of claim 1, wherein said gate electrode comprises W/TiN, Mo, Ta, TaN, TiN or TaSi$_x$N$_y$.

5. The IC of claim 1, wherein an average N concentration in said SiON layer is at least 8 atomic %, and a peak N concentration in said SiON layer is at least 15 atomic %.

6. An integrated circuit (IC) including, comprising:
a substrate having a top semiconductor surface including at least one MOS device, said MOS device comprising:
  a source and a drain region spaced apart to define a channel region;
  a SiON gate dielectric layer formed on said top semiconductor surface including over said channel region, said SiON layer extending to a semiconductor interface with said top semiconductor surface;
  a gate electrode on said SiON layer including over said channel region, wherein said SiON layer extends to a gate electrode interface with said gate electrode;
  wherein a N concentration at said semiconductor interface is <2 atomic %, an average N concentration throughout said SiON layer is at least 8 atomic %, and a peak N concentration in said SiON layer is at least 15 atomic %.

7. The IC of claim 6, wherein said gate electrode comprises polysilicon.

8. The IC of claim 6, wherein said SiON layer comprise a plurality of different N concentration portions including (i) a bottom portion extending to said semiconductor interface with said top semiconductor surface having an average N concentration of <2 atomic %, (ii) a bulk portion on said bottom portion having an average N concentration >10 atomic %, and (iii) a top portion on said bulk portion extending to said gate electrode interface having an average N concentration that is ≥2 atomic % less than a peak N concentration of said bulk portion.

9. The IC of claim 6, wherein said bottom portion is 1-2 monolayer thick, said bulk portion is 2-6 monolayer thick and wherein said peak N concentration of said bulk portion is 20-40 atomic %, and wherein said top portion is 1-2 monolayers thick and has an average N concentration of 4 to 18 atomic %.

* * * * *